US008611135B2

(12) United States Patent
Wang et al.

(10) Patent No.: US 8,611,135 B2
(45) Date of Patent: Dec. 17, 2013

(54) METHOD FOR PROGRAMMING A RESISTIVE MEMORY CELL, A METHOD AND A MEMORY APPARATUS FOR PROGRAMMING ONE OR MORE RESISTIVE MEMORY CELLS IN A MEMORY ARRAY

(75) Inventors: Weijie Wang, Singapore (SG); Rong Zhao, Singapore (SG); Kok Leong Desmond Loke, Singapore (SG); Luping Shi, Singapore (SG); Minghua Li, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 78 days.

(21) Appl. No.: 13/436,053

(22) Filed: Mar. 30, 2012

(65) Prior Publication Data
US 2012/0250403 A1 Oct. 4, 2012

(30) Foreign Application Priority Data
Mar. 30, 2011 (SG) .............................. 201102276-1

(51) Int. Cl.
*G11C 11/00* (2006.01)
(52) U.S. Cl.
USPC ......................................... 365/148; 365/163
(58) Field of Classification Search
USPC ............. 365/148, 158, 171, 173, 163, 189, 7, 365/189.08
See application file for complete search history.

(56) References Cited

U.S. PATENT DOCUMENTS

| | | | |
|---|---|---|---|
| 2004/0264234 A1* | 12/2004 | Moore et al. | 365/148 |
| 2007/0047296 A1* | 3/2007 | Philipp et al. | 365/163 |
| 2008/0043521 A1* | 2/2008 | Liaw et al. | 365/163 |
| 2010/0182826 A1 | 7/2010 | Czubatyj | |
| 2010/0226168 A1 | 9/2010 | Savransky | |
| 2011/0194328 A1* | 8/2011 | Kim et al. | 365/148 |

OTHER PUBLICATIONS

Wong, et al., Phase Change Memory, 98 Proc. IEEE, 2201 (IEEE 2010).

* cited by examiner

*Primary Examiner* — Vanthu Nguyen
*Assistant Examiner* — Hien Nguyen
(74) *Attorney, Agent, or Firm* — K. David Crockett, Esq.; Niky Economy Syrengelas, Esq.; Crockett & Crockett, PC

(57) ABSTRACT

A method for programming a resistive memory cell is provided. The method may include providing a programming signal to the resistive memory cell. The programming signal may include an electrical pulse and a bias pulse coupled with the electrical pulse. The electrical pulse includes an electrical pulse portion, and the bias pulse includes at least two bias pulse portions, wherein the electrical pulse portion is positioned between the at least two bias pulse portions. The bias pulse includes a voltage below a threshold switching voltage of the resistive memory cell. The programming signal includes a peak voltage above the threshold switching voltage of the resistive memory cell.

22 Claims, 9 Drawing Sheets

METHOD FOR PROGRAMMING A RESISTIVE MEMORY CELL, A METHOD AND A MEMORY APPARATUS FOR PROGRAMMING ONE OR MORE RESISTIVE MEMORY CELLS IN A MEMORY ARRAY

CROSS-REFERENCE TO RELATED APPLICATION

This application claims priority from Singapore provisional patent application number 201102276-1, filed 30 Mar. 2011, the content of it being hereby incorporated by reference in its entirety for all purposes.

TECHNICAL FIELD

Various embodiments relate to methods and a memory apparatus. In various embodiments, the method is for programming a resistive memory cell. In various embodiments, the method and the memory apparatus are for programming one or more resistive memory cells in a resistive memory array.

BACKGROUND

Phase Change Random Access Memory (PCRAM) is considered as one of the leading contenders for the next generation nonvolatile semiconductor memory technologies due to its competitive advantages of speed, power saving, capacity, reliability, process integration and low cost.

PCRAM relies primarily on phase-change materials to store information. Such information can be written via the transformation of the materials between the amorphous and crystalline states and retrieved by sensing their difference in resistivity.

Transformation mechanisms involve the melting and quenching of the materials to the amorphous state and the heating of the materials at lower temperatures to the crystalline state.

SUMMARY

Various embodiments provide a method for programming a resistive memory cell, the method including providing a programming signal to the resistive memory cell, the programming signal including an electrical pulse, and a bias pulse coupled with the electrical pulse; wherein the electrical pulse includes an electrical pulse portion, and the bias pulse includes at least two bias pulse portions, the electrical pulse portion being positioned between the at least two bias pulse portions, wherein the bias pulse includes a voltage below a threshold switching voltage of the resistive memory cell, and wherein the programming signal includes a peak voltage above the threshold switching voltage of the resistive memory cell.

Various embodiments provide a method for programming one or more resistive memory cells in a resistive memory array, the method including providing a programming signal to the one or more resistive memory cells, the programming signal including an electrical pulse, and a bias pulse coupled with the electrical pulse; wherein the electrical pulse includes an electrical pulse portion, and the bias pulse includes at least two bias pulse portions, the electrical pulse portion being positioned between the at least two bias pulse portions, wherein the bias pulse includes a voltage below a threshold switching voltage of the one or more resistive memory cells, and wherein the programming signal includes a peak voltage above the threshold switching voltage of the one or more resistive memory cells.

Various embodiments provide a method for programming a resistive memory cell, the method including providing a programming signal to the resistive memory cell, the programming signal including an electrical pulse portion, and at least two bias pulse portions, the electrical pulse portion being positioned between the at least two bias pulse portions; wherein each of the at least two bias pulse portions includes a respective voltage below a threshold switching voltage of the resistive memory cell, and wherein the programming signal includes a peak voltage above the threshold switching voltage of the resistive memory cell.

Various embodiments provide a memory apparatus including a memory array, the memory array including one or more resistive memory cells; and a programming circuit coupled with the one or more resistive memory cells and configured in use to provide a programming signal to the one or more resistive memory cells to program the one or more resistive memory cells, the programming signal including an electrical pulse, and a bias pulse coupled with the electrical pulse; wherein the electrical pulse includes an electrical pulse portion, and the bias pulse includes at least two bias pulse portions, the electrical pulse portion being positioned between the at least two bias pulse portions, wherein the bias pulse includes a voltage below a threshold switching voltage of the one or more resistive memory cells, and wherein the programming signal includes a peak voltage above the threshold switching voltage of the one or more resistive memory cells.

Various embodiments provide a memory apparatus including a memory array, the memory array including one or more resistive memory cells; and a programming circuit coupled with the one or more resistive memory cells and configured in use to provide a programming signal to the one or more resistive memory cells to program the one or more resistive memory cells, the programming signal including an electrical pulse portion, and at least two bias pulse portions, the electrical pulse portion being positioned between the at least two bias pulse portions; wherein each of the at least two bias pulse portions includes a respective voltage below a threshold switching voltage of the one or more resistive memory cells, and wherein the programming signal includes a peak voltage above the threshold switching voltage of the one or more resistive memory cells.

BRIEF DESCRIPTION OF THE DRAWINGS

In the drawings, like reference characters generally refer to like parts throughout the different views. The drawings are not necessarily to scale, emphasis instead generally being placed upon illustrating the principles of some example embodiments of the invention. In the following description, various example embodiments of the invention are described with reference to the following drawings, in which.

DETAILED DESCRIPTION

Figure 1:
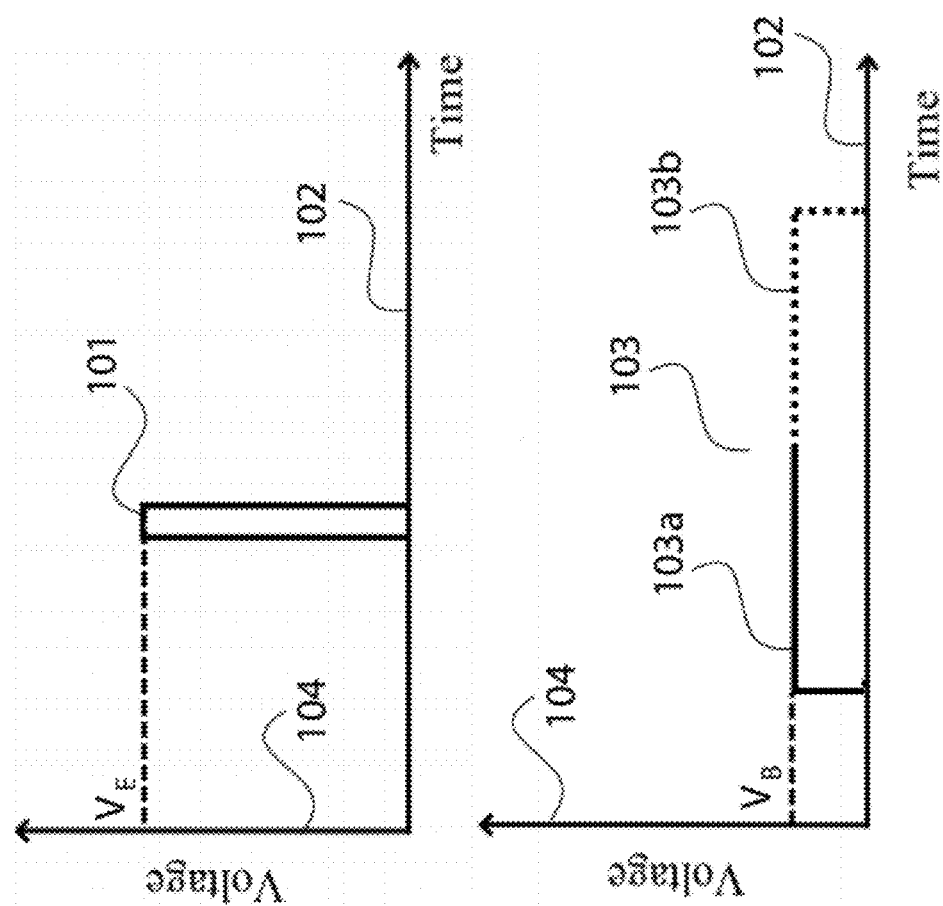
FIG. 1 shows an electrical pulse and a bias pulse included in a SET pulse according to an embodiment.

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In a Phase Change Random Access Memory (PCRAM), the contrast between the amorphous and crystalline states is determined mainly by the ability of the phase-change material to crystallize to the lowest resistance level, also referred to as a SET state; and to amorphize to the highest resistance level, also referred to as a RESET state. Although the following implementations are illustrated using a PCRAM as an example, it should be noted that the embodiments may also be provided in other implementations of a resistive memory cell such as e.g. a Conductive Bridging Random Access Memory (CBRAM) or a Magnetoresistive Random Access Memory (MRAM) or any other type of resistive memory technology.

Various embodiments provide a method for programming a resistive memory cell, the method including providing a programming signal to the resistive memory cell, the programming signal including an electrical pulse, and a bias pulse coupled with the electrical pulse; wherein the electrical pulse includes an electrical pulse portion, and the bias pulse includes at least two bias pulse portions, the electrical pulse portion being positioned between the at least two bias pulse portions, wherein the bias pulse includes a voltage below a threshold switching voltage of the resistive memory cell, and wherein the programming signal includes a peak voltage above the threshold switching voltage of the resistive memory cell.

In an embodiment, the resistive memory cell includes a phase change memory cell.

In an embodiment, the programming signal reduces the resistance of the resistive memory cell to a level corresponding to a SET state of the resistive memory cell.

In an embodiment, the threshold switching voltage is in the range from about 0.3 V to about 2 V.

In an embodiment, the threshold switching voltage is in the range from about 0.4 V to about 1 V.

In an embodiment, the threshold switching voltage is in the range from about 0.6 V to about 0.8 V.

In an embodiment, the duration of the bias pulse is longer than the duration of the electrical pulse In an embodiment, the duration of the bias pulse is in the range of nanoseconds to microseconds.

In an embodiment, the duration of the electrical pulse is in the range from about 10 nanoseconds to about 1 microsecond.

In an embodiment, the duration of the electrical pulse is in the range from about 1 nanosecond to about 100 nanoseconds.

In an embodiment, the resistive memory cell is a binary memory cell.

In an embodiment, the resistive memory cell is a multilevel memory cell. As used herein the term "multilevel" memory cell is intended to e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In an embodiment, the resistive memory cell is a multibit memory cell. As used herein the term "multibit" memory cell is intended to e.g. include memory cells which are configured to store a plurality of bits by spatially separated electric charge storage regions or current conductivity regions, thereby representing a plurality of logic states.

In an embodiment, a first programming signal is provided for programming the multilevel memory cell in a first resistance level, and a second programming signal is provided for programming the multilevel memory cell in a second resistance level, wherein the first resistance level is different from the second resistance level.

In an embodiment, the first resistance level and the second resistance level are different from a lowest resistance level of the multilevel memory cell, wherein the lowest resistance level corresponds to a SET state of the multilevel memory cell.

In an embodiment, depending on the resistance level of the multilevel memory cell, various programming signals are provided for programming the multilevel memory cell, the various programming signals varying in one or more of the following: voltage of the bias pulse, the peak voltage of the programming signal, the duration of the bias pulse, the duration of the electrical pulse.

Various embodiments provide a method for programming one or more resistive memory cells in a resistive memory array, the method including providing a programming signal to the one or more resistive memory cells, the programming signal including an electrical pulse, and a bias pulse coupled with the electrical pulse; wherein the electrical pulse includes an electrical pulse portion, and the bias pulse includes at least two bias pulse portions, the electrical pulse portion being positioned between the at least two bias pulse portions, wherein the bias pulse includes a voltage below a threshold switching voltage of the one or more resistive memory cells, and wherein the programming signal includes a peak voltage above the threshold switching voltage of the one or more resistive memory cells.

In an embodiment, the one or more resistive memory cells include one or more phase change memory cells.

The further features described with reference to the first method are equally applicable, and hereby restated, in respect of the above method.

Various embodiments provide a method for programming a resistive memory cell, the method including providing a programming signal to the resistive memory cell, the programming signal including an electrical pulse portion, and at least two bias pulse portions, the electrical pulse portion being positioned between the at least two bias pulse portions; wherein each of the at least two bias pulse portions includes a respective voltage below a threshold switching voltage of the resistive memory cell, and wherein the programming signal includes a peak voltage above the threshold switching voltage of the resistive memory cell.

The further features described with reference to the first method are equally applicable, and hereby restated, in respect of the above method.

Various embodiments provide a memory apparatus including a memory array, the memory array including one or more resistive memory cells; and a programming circuit coupled with the one or more resistive memory cells and configured in use to provide a programming signal to the one or more resistive memory cells to program the one or more resistive memory cells, the programming signal including an electrical pulse, and a bias pulse coupled with the electrical pulse; wherein the electrical pulse includes an electrical pulse portion, and the bias pulse includes at least two bias pulse portions, the electrical pulse portion being positioned between the at least two bias pulse portions, wherein the bias pulse includes a voltage below a threshold switching voltage of the one or more resistive memory cells, and wherein the programming signal includes a peak voltage above the threshold switching voltage of the one or more resistive memory cells.

In an embodiment, the one or more resistive memory cells included in the memory apparatus include one or more phase change memory cells.

The further features described with reference to the first method are equally applicable, and hereby restated, in respect of the above apparatus.

Various embodiments provide a memory apparatus including a memory array, the memory array including one or more resistive memory cells; and a programming circuit coupled with the one or more resistive memory cells and configured in use to provide a programming signal to the one or more resistive memory cells to program the one or more resistive memory cells, the programming signal including an electrical pulse portion, and at least two bias pulse portions, the electrical pulse portion being positioned between the at least two bias pulse portions; wherein each of the at least two bias pulse portions includes a respective voltage below a threshold switching voltage of the one or more resistive memory cells, and wherein the programming signal includes a peak voltage above the threshold switching voltage of the one or more resistive memory cells.

In an embodiment, the one or more resistive memory cells included in the memory apparatus include one or more phase change memory cells.

The further features described with reference to the first method are equally applicable, and hereby restated, in respect of the above apparatus.

Phase-change random access memory (PCRAM) is a leading contender for next-generation nonvolatile semiconductor memory technologies. The competitive advantages of PCRAM include, but are not limited to, higher operating speed, lower power consumption, higher storage capacity, greater reliability, better process integration and lower manufacturing cost.

PCRAM may include a phase-change memory array that includes a plurality of phase-change memory cells. Each cell of the plurality of phase-change memory cells may store data. Being a nonvolatile memory device, each phase-change memory cell may retain its data even when no power is supplied to it. A new data value may be written into a phase-change memory cell, thus replacing the previous data value. Accordingly, the data value stored in a phase-change memory cell may be intentionally changed by a user. Further, the data value stored in each phase-change memory cell may be retrieved or read without changing, disturbing, or compromising the data value stored in the cell.

The ability to write, store, and retrieve information in each phase-change memory cell may be provided by phase-change materials, such as, for example, a chalcogenide alloy of germanium, antimony and tellurium (GST). Phase-change materials may possess two or more different structural states, i.e., a plurality of structural states. The plurality of states of a phase-change material may be distinguished on the basis of different crystal structures, atomic arrangements, fractional crystallinities, relative proportions of two or more different structural states, physical properties (such as, for example, electrical, optical, magnetic, mechanical), or chemical properties. Some of these distinguishing features will be discussed in more detail later.

A phase-change material may possess a plurality of structural states that may include a crystalline state and/or one or more partially-crystalline states and/or an amorphous state. The crystalline state of a phase-change material may include a single-crystalline state or a polycrystalline state. The partially-crystalline state of a phase-change material may be a structural state in which a portion of the phase-change material may be in the amorphous state whilst, simultaneously, another portion of the same phase-change material may be in the crystalline state. The ratio of the volume fraction of the phase-change material in the crystalline state to the volume fraction of the same phase-change material in the amorphous state, expressed as a percentage, may be referred to as the fractional crystallinity of a phase-change material. For example, the fractional crystallinity of a phase-change material in the fully crystalline state may be 100%, the fractional crystallinity of a phase-change material in the fully amorphous state may be 0%, and the fractional crystallinity of a phase-change material in the partially crystalline state may be any value between 0% (fully amorphous) and 100% (fully crystalline), such as, for example, any value between 0% and 100%, or between 10% and 90%, or between 20% and 80%, or between 30% and 70%, or between 40% and 60%.

A phase-change material may also possess a plurality of partially-crystalline states. Each state of the plurality of partially-crystalline states may also be distinguished on the basis of its fractional crystallinity. For example, the fractional crystallinity of each state of the plurality of partially-crystalline states may vary continuously between 0% (fully amorphous) and 100% (fully crystalline). Consequently, the plurality of states of a phase-change material may be distinguished on the basis of their fractional crystallinities.

The physical properties of a phase-change material may vary with its fractional crystallinity. Stated differently, the physical properties of a phase-change material may change with its structural state. The physical properties of a phase-change material may be measurable properties, such as, for example, resistance, magnetic permeability, refractive index, or electrical susceptibility. Consequently, numbers obtained from measuring the physical properties of a phase-change material may be associated with each state of the plurality of structural states of the phase-change material.

The resistance of a phase-change material may vary with its state. Accordingly, a resistance value may be associated with each state of the plurality of structural states of the phase-change material. Further, each structural state of a phase-change material may be associated with a distinct, unique resistance value. Accordingly, the plurality of structural states of a phase-change material may also be distinguished on the basis of the resistance of a phase-change material. Consequently, structural states of a phase-change material may also be referred to as resistance states of a phase-change material.

A phase-change material may be able to reversibly transformation between or among the plurality of structural states. Accordingly, a phase-change material may be able to change its resistance in accordance with its structural state. Therefore, controlling the resistance of a phase-change material may be achieved through controlling the structural state of the phase-change material. Stated differently, the resistance of a phase-change material may be varied by controlling its fractional crystallinity. Typically, the crystalline state of a phase-change material, i.e., fractional crystallinity of 100%, may have the lowest resistance, while the amorphous state of a phase-change material, i.e., fractional crystallinity of 0%, may have the highest resistance.

Transformations between or among the plurality of structural states may be effected by providing energy to the phase-change material. The energy provided to a phase-change material to transform its state between or among its plurality of structural states may be electrical energy, thermal energy, optical energy, or other forms of energy.

Thermal energy provided to the phase-change material may transform the structural state of a phase-change material. For example, the crystalline state of a phase-change material may be transformed by thermal energy to a partially-crystalline state or an amorphous state. Similarly, the partially-crystalline state of a phase-change material may be transformed by thermal energy to a crystalline state, an amorphous state or a different partially-crystalline state. In like manner, the amorphous state of a phase-change material may be transformed by thermal energy to a partially-crystalline state or a crystalline state.

A phase-change material in a partially-crystalline state or in the crystalline state may be transformed to its amorphous state by heating the phase-change material above its melting temperature and rapidly cooling the phase-change material. Rapidly cooling the phase-change material may include a cooling rate that is sufficient to inhibit the formation of a regular arrangement of crystals in a phase-change material. This rapid cooling of a phase-change material may also be referred to as quenching, and may result in a highly irregular arrangement of atoms in the phase-change material, thus yielding its amorphous state.

A phase-change material in the amorphous state or in a partially-crystalline state may be transformed to the crystalline state by heating the phase-change material above its crystallization temperature for a sufficient period of time to induce nucleation and growth of crystalline domains while preventing quenching of the phase-change material. The crystallization temperature is the minimum temperature at which crystallization in a material may occur, and the crystallization temperature is below the melting temperature.

The fractional crystallinity of a phase-change material, and hence, its structural state, may be controlled by varying the temperature and/or time of heating and/or rate of cooling of the phase-change material. Accordingly, proper control of the peak temperature and/or time of heating and/or rate of cooling may achieve structural states of a phase-change material that span the full range of fractional crystallinities in a phase-change material, namely, from 0% fractional crystallinity (amorphous state) to 100% fractional crystallinity (crystalline state), inclusive.

Electrical energy may be converted to thermal energy in order to transform the state of a phase-change material. The electrical energy may be provided by electrical pulses applied to the phase-change material in each phase-change memory cell. The electrical pulse may include a current pulse or a voltage pulse. The electrical energy of an electrical pulse may be converted to thermal energy by Joule heating, namely, the conversion of electrical energy to thermal energy through resistance to current flow. The resistance to current flow may generate heat, which may lead to an increase in the temperature of the phase-change material. The heat generated by Joule heating, and hence, temperature of the phase-change material, may be controlled by varying the time duration and/or amplitude of the voltage pulse or the current pulse.

More insight into Joule heating may be gained by considering the following. The crystalline portions of a phase-change material, having a regular atomic arrangement, may be sufficiently conductive to permit current densities that provide efficient Joule heating. Conversely, the amorphous portions, having a highly irregular atomic arrangement, may be less conductive and may not support current densities sufficient to heat the material to the crystallization temperature. However, amorphous portions of a phase-change material may be electrically switched to become highly conductive upon application of a voltage greater than a threshold switching voltage. When this occurs, the amorphous portions of a phase-change material may support a current density high enough to heat the material to the crystallization temperature through Joule heating. This may also be referred to as a threshold switching event. When the applied voltage equals or exceeds the threshold switching voltage, the amorphous portions of a phase-change material become highly conductive almost instantaneously. The threshold switching voltage may vary depending on the structure, the thickness, and/or the phase-change material in the phase-change memory cell.

Once the amorphous portions of a phase-change material become highly conductive, these volume fractions may undergo nucleation and growth of a crystalline phase. This process may take a relatively short amount of time. Therefore, by controlling the amplitude and/or time duration of electrical pulses applied to a phase-change material, it may be possible to continuously the fractional crystallinity of a phase-change material. Once formed, the crystalline phase is retained upon removing the applied voltage after switching due to the non-volatile nature of phase-change memory cells.

The electrical energy applied to a phase-change material may transform its structural state, and thus, its resistance. Writing data into a phase-change memory cell, or a programming operation, may include applying a voltage pulse or a current pulse to a phase-change material to transform its structural state from one state to another, thus changing its resistance from one resistance value to another. Each resistance value may correspond to a unique data value.

The data value stored in each phase-change memory cell may be retrieved by measuring the resistance of the phase-change material within the cell. Retrieving information from a phase-change memory cell, or a read operation, may be achieved by providing a current pulse or a voltage pulse to measure the resistance of the phase-change material, and thus, ascertain the data value programmed into the phase-change memory cell. The energy of the read pulse may be sufficiently low to prevent any transformation of the structural state of the phase-change material. Accordingly, read operations may be performed without changing, disturbing, or compromising the data value stored in the cell.

Data may be programmed into a phase-change memory cell in binary mode, namely, the data value may be one of two logical states. These two logical states are commonly known as the binary "0" and the binary "1" states. In the binary mode, the phase-change material within each phase-change memory cell included in a phase-change memory array may be operated between two structural states. A first state may be designated the data value "1" and a second state may be designated the data value "0". Alternatively, the first state may be designated the data value "0" and the second state may be designated the data value "1". In order to improve the ability to discriminate between the two data values, the two structural states (or resistance states) may be selected to provide a large contrast of resistance values.

The range of resistance values of a phase-change material may be bounded by a SET state associated with a SET resistance, and a RESET state associated with a RESET resistance. The SET state may be associated with the lowest resistance of a phase-change material. Accordingly, the SET state may be associated with the crystalline state of a phase-change material. Similarly, the RESET state may be associated with the highest resistance of a phase-change material. Accordingly, the RESET state may be associated with the amorphous state of a phase-change material. In order to provide a large contrast of resistance values, the resistance of the RESET state may be at least a factor of two, and more typically an order of magnitude or more, greater than the resistance of the SET state. The SET state may be associated with the binary "0" state, and the RESET state may be associated with the binary "1" state. Alternatively, the SET state may be associated with the binary "1" state, and the RESET state may be associated with the binary "0" state.

In a binary programming operation, a phase-change material may be programmed from the SET state to the RESET state. Therefore, a phase-change material in the crystalline state may be heated to its melting point or near its melting point. The melted phase-change material may then be quenched so that it is transformed to the highest resistance amorphous state (RESET state). The programming of the phase-change material to the RESET state may be referred to as a RESET process.

In a binary programming operation, a phase-change material may be programmed from the RESET state to the SET state. Therefore, a phase-change material in the amorphous phase may be heated to its crystallization temperature or near its crystallization temperature (but below its melting temperature). This may induce nucleation and crystallization in the phase-change material, thus transforming the phase-change material to the lowest resistance crystalline state (SET state). The programming of the phase-change material to the SET state may be referred to as a SET process.

In a binary programming operation, a phase-change material starting in the SET state may undergo repeated transformations between the SET and RESET states. Similarly, a phase-change material starting in the RESET state may undergo repeated transformations between the RESET and SET states. Each of these binary programming operations may be referred to as a SET/RESET cycle.

The resistance state of each phase-change memory cell may drift over time even if no energy is applied to the phase-change material to intentionally transform its state. Stated differently, the resistance of a phase-change material may change over time even if no programming operation is performed. This may be referred to as resistance drift. Illustratively, if a phase-change memory cell is programmed into a particular structural state having a unique resistance at one time, the resistance of the cell may be different if measured at a later time. Accordingly, data may be misread during a read operation. As is commonly the case, resistance of a phase-change material increases with time and may become more pronounced as the amorphous volume fraction of a structural state increases. Stated differently, resistance drift is a bigger problem with the RESET state, and less of a problem with the SET state.

Resistance drift may require the phase-change material to be re-initialized to the SET state after a high number of SET/RESET cycles. Further, due to tolerances typically present in any manufacturing process, phase-change materials in the phase-change cells included in PCRAM may have different initial resistances. Accordingly, newly manufactured PCRAM may also require initialization to the SET state before the first programming operation. Initialization or re-initialization may also be referred to as area erase or block erase.

Whilst the above-mentioned processes may be easy to understand, difficulties exist in the SET process. Due to the high operating speeds of modern day PCRAM, crystallization may have to be induced within a short time period. Accordingly, this necessitates the use of a small voltage window, namely, short time duration, high amplitude electrical pulses. The small voltage window may place severe limitations on the precise voltage amplitude and pulse duration required to switch phase-change cells to the lowest resistance level. Errors in voltage amplitude and pulse duration during the SET process may lead to only partial crystallization of the phase-change material. This may lead to varying resistance states amongst the phase-change cells of PCRAM. Further, errors in voltage amplitude and pulse duration during the SET process may lead to re-amorphization of the phase-change cells, instead of crystallization. These issues in the SET process state also makes it difficult to sense the lowest resistance state of the cells when a read operation is performed. Additionally, a phase-change memory array wherein each phase-change memory cell has a different SET state may also result in non-uniformed RESET voltage and resistance levels.

Difficulties may also exist in the initialization or re-initialization of the phase-change cell. Initialization of the phase-change cell are typically induced by high amplitude current or voltage pulses that have long time durations. This may be due to the high activation energy of as-deposited phase-change material and the wide variations in the initial cell resistance levels.

One method of resolving these issues may be through the initialization of the cells by employing electrical pulses with higher voltages or longer time durations than a conventional SET pulse, i.e., the voltage pulse used in the SET process. However, the effectiveness of this method is limited by the time duration within which crystallization and re-amorphization have to occur in modern day PCRAM.

Another method of solving these issues may be through a program control. In this case, a memory controller may first read the resistance level of all phase-change memory cells, and may subsequently generate a corresponding SET pulse to set each cells to the lowest resistance state. However, this may increase the complexity of the memory array. This may also increase the power consumption and switching speed of the phase-change memory cells.

Hence, there is a need to develop programming methods to effectively switch the PCRAM from various high resistance levels to the desired SET resistance levels and to achieve good resistance uniformity within a short time duration. Block or area erase of phase-change memory cells operating in the binary mode may be referred to as single level programming.

Applying a low bias before and after an electrical pulse may achieve crystallization of a phase-change material to the lowest resistance level. In an embodiment, a low bias voltage pulse may be a DC pulse. A low bias voltage may induce the phase-change material in a phase-change memory cell to reach low temperatures that promote nucleation. In this context, low temperature refers to any temperature below the crystallization temperature. Such a low bias voltage pulse may enable fast crystal growth when a short time duration, high voltage electrical pulse above the threshold switching voltage is applied. Consequently, this may lead to a complete crystallization of the material within the pulse duration. A low bias voltage pulse applied after a short time duration, high voltage electrical pulse may prevent quenching of a phase-change material, while promoting the stabilization of the newly formed crystalline structural state.

FIG. 1 shows an electrical pulse 101 and a bias pulse 103 included in a SET pulse according to an embodiment. The shapes of the electrical pulse 101 and the bias pulse 103 are illustrative and not intended to be limiting. Time increases along a horizontal axis 102 and voltage increases along a vertical axis 104. In an embodiment, the SET pulse may include be a single electrical pulse 101 coupled with a DC bias pulse 103. In an embodiment, a SET pulse may include the electrical pulse 101 and a bias pulse 103. In an embodiment, the bias pulse may include at least two bias pulse portions 103a, 103b. In an embodiment, the electrical pulse portion 101 may be positioned between the at least two bias pulse portions 103a, 103b. In an embodiment, the bias pulse 103 may include a voltage $V_B$ below the threshold switching voltage of a phase change memory cell. In an embodiment, the electrical pulse 101 may include a peak voltage $V_E$ above the threshold switching voltage of a phase change memory cell.

Figure 2:
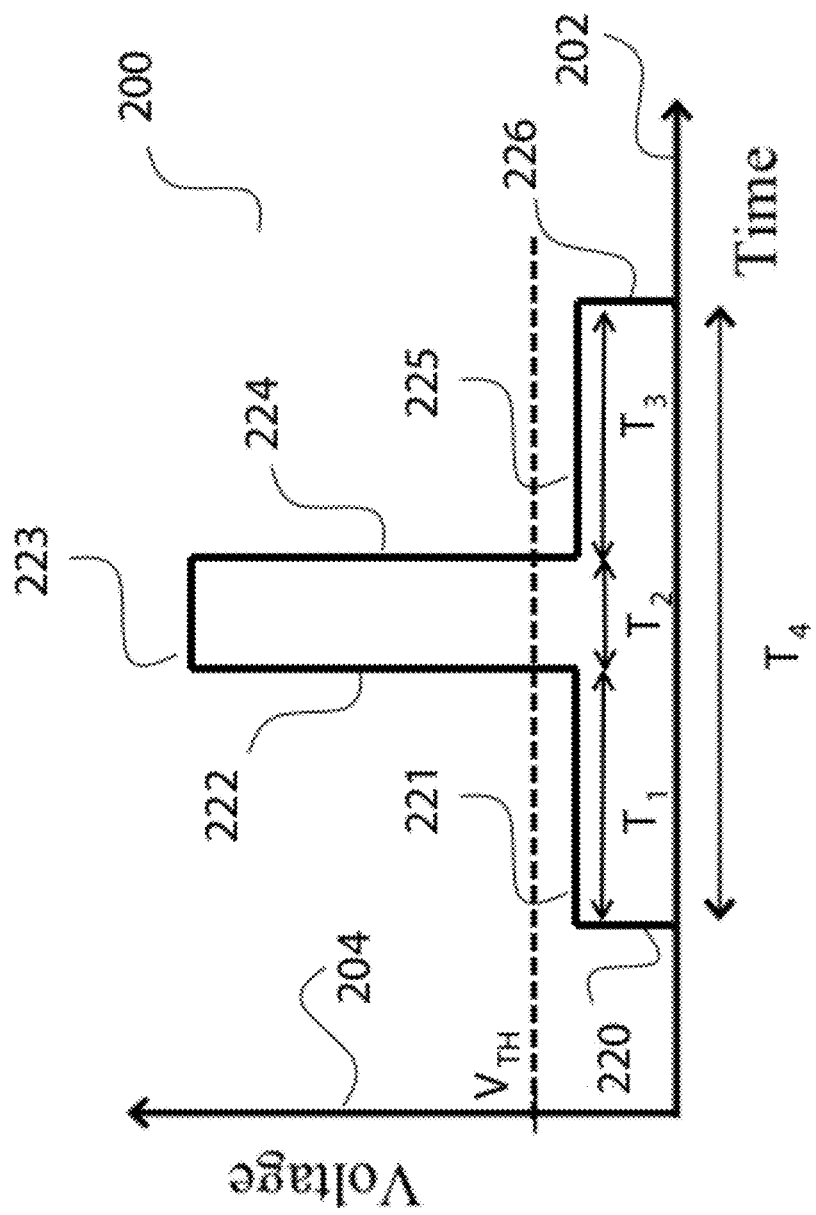
FIG. 2 shows a SET pulse for single level programming according to an embodiment.

FIG. 2 shows a SET pulse 200 for single level programming according to an embodiment. The shape of the SET pulse 200 is illustrative and not intended to be limiting. Time increases along a horizontal axis 202 and voltage increases along a vertical axis 204. In an embodiment, the SET pulse may include a low-high-low configuration. A first segment of the low-high-low configuration may achieve fast nucleation. A second segment of the low-high-low configuration may achieve crystal growth. A third segment of the low-high-low configuration may prevent quenching whilst achieving stabilization of the phase-change material.

In an embodiment, the SET pulse 200 may include an electrical pulse and a bias pulse coupled to the electrical pulse. In an embodiment, an initial leading edge 220 followed by a plateau 221 of time duration $T_1$. In an embodiment, the amplitude of plateau 221 may be less than the threshold switching voltage $V_{TH}$ of the phase-change material. In an embodiment, the threshold switching voltage $V_{TH}$ may be in the range of 0.3 V to 2 V. In another embodiment, the threshold switching voltage may be in the range of 0.4 V to 1 V. In a further embodiment, the threshold switching voltage may be in the range of 0.6 V to 0.8 V. In an embodiment, the amplitude of plateau 221 may be in the range of 0.1 V to 0.3 V. In another embodiment, the amplitude of the plateau 221 may be in the range 0.3 V to 0.4 V. In a further embodiment, the amplitude of the plateau 221 may be in the range 0.4 V to 0.5 V. In other embodiments, the amplitude of the plateau 221 may be another value below the threshold switching voltage $V_{TH}$ of the phase-change material included in the phase-change memory cell.

In an embodiment, the voltage amplitude and time duration $T_1$ of plateau 221 may result in the nucleation of the phase-change material and heating of the phase-change material to a temperature below the crystallization temperature. As utilized herein, the crystallization temperature may also be referred to as the glass transition temperature. For phase-change materials such as $Ge_2Sb_2Te_5$, the glass transition temperature may be about 150° C. In an embodiment, the low temperature heating of the phase-change material below the glass transition temperature during the pulse duration $T_1$ may result in the formation of adsorbed monomers and nuclei within the phase-change material. These monomers and nuclei may coalesce to form small islands. The time duration $T_1$ of plateau 221 may be from several tens of nanoseconds to a few microseconds, or more, depending on phase-change material parameters such as, for example, dimensions of the phase-change memory cell, the composition of the chalcogenide alloy of the phase-change material, the threshold switching voltage of the phase change memory cell, among other things. In an embodiment, the time duration $T_1$ may be in the range of about 20 nanoseconds to about 100 microseconds, or in the range of about 30 nanoseconds to about 50 microseconds, or in the range of about 50 nanoseconds to about 10 microseconds, or in the range of about 60 nanoseconds to about 1 microsecond, or in the range of about 80 nanoseconds to about 800 nanoseconds, or in the range of about 100 nanoseconds to about 600 nanoseconds, or in the range of about 200 nanoseconds to about 400 nanoseconds.

In an embodiment, the leading edge 222 and plateau 223 of time duration $T_2$ may result in the heating of the phase-change material to a temperature above the glass transition temperature. The amplitude of plateau 223, including a peak voltage $V_P$, may be greater than the threshold switching voltage $V_{TH}$ so that a threshold switching event may occur. In an embodiment, the peak amplitude $V_P$ of the plateau 223 may be a value above the threshold switching voltage $V_{TH}$, such as, for example, a value in the range of 0.3 V to 10 V. In an embodiment, the peak amplitude $V_P$ may be in the range of 1 V to 9 V, or in the range of 2 V to 8 V, or in the range of 3 V to 7 V, or in the range of 4 V to 6 V. In an embodiment, the heating of the phase-change material at higher temperatures during the pulse duration of plateau 223, i.e., during $T_2$, may result in the rapid growth of monomers and nuclei, and full crystallization of the phase-change material. This may result in a sharp drop in the resistance level of the PCRAM in a short period of time. In an embodiment, the time duration of the leading edge 222 may be less than ten nanoseconds, such as, for example, 1 ns to 10 ns, or 2 ns to 9 ns, or 3 ns to 8 ns, or 4 ns to 7 ns, or 5 ns to 6 ns. In an embodiment, the time duration $T_2$ of plateau 223 may be in the range of a few hundred picoseconds, a few nanoseconds, to more than a few hundreds of nanoseconds, depending on phase-change material parameters such as, for example, dimensions of the phase-change memory cell, the composition of the chalcogenide alloy of the phase-change material, the threshold switching voltage of the phase change memory cell, among other things. In an embodiment, the time duration $T_2$ may be in the range of about 200 picoseconds to about 1 microsecond, or in the range of about 400 picoseconds to about 700 nanoseconds, or in the range of about 800 picoseconds to about 500 nanoseconds, or in the range of about 1 nanosecond to about 300 nanoseconds, or in the range of about 50 nanoseconds to about 200 nanoseconds, or in the range of about 80 nanoseconds to about 100 nanoseconds.

In an embodiment, the trailing/falling edge 224 brings the amplitude of the SET pulse 200 down to plateau 225. In an embodiment, the amplitude of plateau 225 may have the same amplitude as plateau 221. In an embodiment another trailing/falling edge 226 brings the amplitude of the SET pulse 200 down to zero. In an embodiment, the amplitude of the plateau 225 may be different from the amplitude of the plateau 221. In an embodiment, the plateau 225 of time duration $T_3$ may result in heating of the phase-change material below the glass transition temperature. In an embodiment, the time duration $T_4$ of the SET pulse 200 may range from a few tens of nanoseconds to a few milliseconds, or more, depending on phase-change material parameters such as, for example, dimensions of the phase-change memory cell, the composition of the chalcogenide alloy of the phase-change material, the threshold switching voltage of the phase change memory cell, among other things. In an embodiment, the time duration $T_4$ may be in the range of about 20 nanoseconds to about 50 milliseconds, or in the range of about 50 nanoseconds to about 20 milliseconds, or in the range of about nanoseconds to about 10 milliseconds, or in the range of about 100 nanoseconds to about 1 millisecond, or in the range of about 500 nanoseconds to about 800 microseconds, or in the range of about 800 nanoseconds to about 500 microseconds, or in the range of about 1 microsecond to about 400 microseconds, or in the range of about 100 microseconds to about 300 microseconds.

In an embodiment, the two portions of a bias pulse of the programming signal may include plateau 221 and plateau 225. In an embodiment, the electrical pulse portion of the programming signal may include the leading edge 222, the plateau 223, and the trailing/falling edge 224. In an embodiment, the subsequent low temperature heating of the phase-change material during plateau 225 for time duration T3 may result in the stabilization of the phase-change material and the prevention of quenching of the phase-change material. In an embodiment, plateau 225 may result in the fully crystalline state of the phase-change material. Electrical pulses with higher voltages may result in overheating of the phase change materials. Further, sudden removal of these higher voltages may result in re-amorphization of the phase-change material. Accordingly, the low temperature heating by the low voltage bias 225 may also avoid these problems. Accordingly, low power initialization of phase-change materials may be achievable. The duration of plateau 225, i.e., time duration T3, may be from a few tens nanoseconds to a few microseconds, or more depending on phase-change material parameters such as, for example, dimensions of the phase-change memory cell, the composition of the chalcogenide alloy of the phase-change material, the threshold switching voltage of the phase change memory cell, among other things. In an embodiment, the time duration T3 may be in the range of about 20 nanoseconds to about 100 microseconds, or in the range of about 30 nanoseconds to about 50 microseconds, or in the range of about nanoseconds to about 10 microseconds, or in the range of about 60 nanoseconds to about 1 microsecond, or in the range of about 100 nanoseconds to about 900 nanoseconds, or in the range of about 300 nanoseconds to about 700 nanoseconds, or in the range of about 400 nanoseconds to about 600 nanoseconds. In an embodiment, variations in the pulse profiles may be employed for different device applications.

Figure 3:
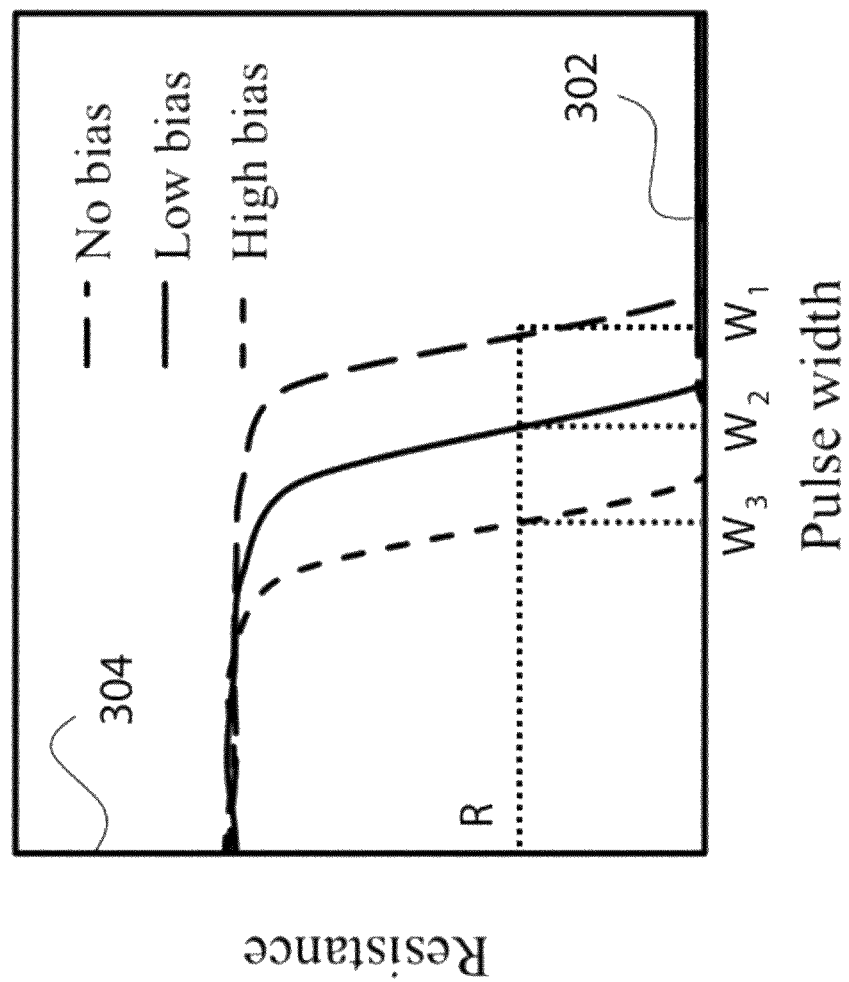
FIG. 3 shows the relation between PCRAM resistance and electrical pulse width at different bias voltages according to an embodiment.

FIG. 3 shows the relation between PCRAM resistance and electrical pulse width at different bias voltages according to an embodiment. The shape of the curves is illustrative and not intended to be limiting. Electrical pulse width, measured as time duration, increases along a horizontal axis 302 and resistance increases along a vertical axis 304. To achieve a SET resistance R, a conventional SET pulse including an electrical pulse, but not including a bias voltage, may require a pulse width W1. In an embodiment, a SET pulse may include a low bias voltage coupled with an electrical pulse. In an embodiment, the pulse width of the SET pulse including a low bias voltage coupled with an electrical pulse may have a pulse width W2. In an embodiment, the pulse width W2 may be smaller than the pulse width W1. In an embodiment, the reduction in pulse width from W1 to W2 may be from a few nanoseconds to several ten nanoseconds, such as, for example, the reduction may be in the range of about 3 nanoseconds to about 60 nanoseconds, or in the range of about 10 nanoseconds to about 40 nanoseconds, or in the range of about 20 nanoseconds to about 30 nanoseconds. In an embodiment, a SET pulse may include a high bias voltage coupled with an electrical pulse. In an embodiment, the pulse width of the SET pulse including a high bias voltage coupled with an electrical pulse may have a pulse width W3. In an embodiment, the pulse width W3 may be smaller than the pulse width W2. In an embodiment, the pulse width W3 may also be smaller than the pulse width W1. In an embodiment, the reduction in pulse width from W2 to W3 may be from a few nanoseconds to several ten nanoseconds, such as, for example, the reduction may be in the range of about 3 nanoseconds to about 50 nanoseconds, or in the range of about 10 nanoseconds to about 40 nanoseconds, or in the range of about 20 nanoseconds to about 30 nanoseconds.

Figure 4:
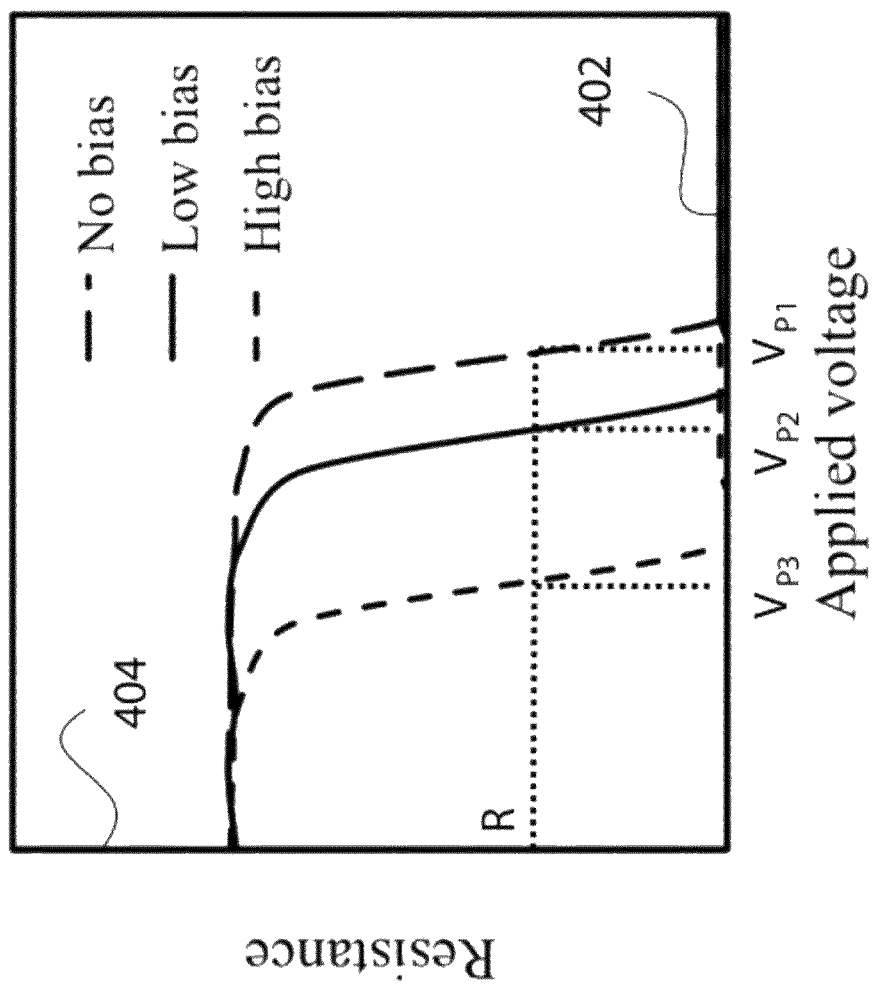
FIG. 4 shows the relation between PCRAM resistance and applied voltage at different bias voltages according to an embodiment.

FIG. 4 shows the relation between PCRAM resistance and peak applied voltage $V_P$ at different bias voltages according to an embodiment. The shape of the curves is illustrative and not intended to be limiting. Applied voltage increases along a horizontal axis 402 and resistance increases along a vertical axis 404. To achieve a SET resistance R a conventional SET pulse including an electrical pulse, but not including a bias voltage, may require an applied voltage $V_{P1}$. In an embodiment, a SET pulse may include a low bias voltage coupled with an electrical pulse. In an embodiment, the applied voltage of the SET pulse including a low bias voltage coupled with an electrical pulse may have a voltage $V_{P2}$. In an embodiment, the applied voltage $V_{P2}$ may be smaller than the applied voltage $V_{P1}$. In an embodiment, the reduction in applied voltage from $V_{P1}$ to $V_{P2}$ may be 0.1 V to 1 V. For example, the difference between $V_{P1}$ and $V_{P2}$ may be 0.1 V to 1 V, or 0.2 V to 0.9 V, or 0.3 V to 0.8V, or 0.4 V to 0.7 V, or 0.5 V to 0.6 V. In an embodiment, a SET pulse may include a high bias voltage coupled with an electrical pulse. In an embodiment, the applied voltage of the SET pulse including a high bias voltage coupled with an electrical pulse may have a voltage $V_{P3}$. In an embodiment, the applied voltage $V_{P3}$ may be smaller than the applied voltage $V_{P2}$. In an embodiment, the applied voltage $V_{P3}$ may also be smaller than the applied voltage $V_{P1}$. In an embodiment, the reduction in applied voltage from $V_{P2}$ to $V_{P3}$ may be 0.1 V to 1 V. For example, the difference between $V_{P2}$ and $V_{P3}$ may be 0.1 V to 1 V, or 0.2 V to 0.9 V, or 0.3 V to 0.8V, or 0.4 V to 0.7 V, or 0.5 V to 0.6 V.

In an embodiment, the pulse width of a SET pulse may be varied by varying the applied voltage of the SET pulse. In an embodiment, a first SET pulse may include a first electrical pulse coupled with a first bias pulse. The first electrical pulse may have a first applied voltage, and the first bias pulse may have a first bias voltage. In an embodiment, a second SET pulse may include a second electrical pulse coupled with a second bias pulse. The second electrical pulse may have a second applied voltage, and the second bias pulse may have a second bias voltage. In an embodiment, the second applied voltage may be greater than the first applied voltage, whilst the second bias voltage may be equal to the first bias voltage. In an embodiment, for the same bias voltage, a shorter pulse width may be achieved when a higher applied voltage is used. Consequently, the pulse width of the second SET pulse may be smaller than the pulse width of the first SET pulse. In an embodiment, the reduction in pulse width (i.e., the difference between the pulse widths of the first and second SET pulses) may be from a few nanoseconds to several ten nanoseconds, such as, for example, the reduction may be in the range of about 2 nanoseconds to about 90 nanoseconds, or in the range of about 20 nanoseconds to about 70 nanoseconds, or in the range of about 40 nanoseconds to about 50 nanoseconds.

Similarly, in an embodiment, the applied voltage of a SET pulse may be varied by varying the pulse width of the SET pulse. In an embodiment, a first SET pulse may have a first pulse width and may include a first electrical pulse having a first applied voltage. In an embodiment, a second SET pulse may have a second pulse width and may include a second electrical pulse having a second applied voltage. In an embodiment, the second pulse width may be greater than the first pulse width. In an embodiment, a lower applied voltage may be employed when the pulse width increases. Consequently, the second applied voltage may be lower than the first applied voltage. In an embodiment, the decrease in applied voltage could range from 0.1 V to a few volts, such as, for example, in the range of about 0.1 V to about 9 V, or in the range of about 0.5 V to about 7 V, or about 1 V to about 6 V, or about 3 V to about 4 V. These are exemplary examples, which should not limit use of the technology.

In an embodiment, a phase-change memory cell may be operated over more than the two states used in binary operation. Since the structural states of a phase-change material may be continuously variable over a range of fractional crystallinities from 0% to 100%, a phase-change material may also be operated at resistance states between the lowest SET resistance and highest RESET resistance. Accordingly, multiple bit memory operation over multiple memory states may be possible with phase-change memory cells.

Difficulties associated with multilevel phase-change operation include resistance drift over time. Resistance drift may not be a problem in binary operation of phase-change memory cells because the SET state may show little or no resistance drift, while the RESET state may show pronounced resistance drift. As a result, the resistance contrast between the SET and RESET states increases over time and no impairment of performance may occur.

However, resistance drift is a major impediment in multilevel phase-change operation because time variations in resistance states may lead to confusion in the identification of memory states. This may reduce the reliability and data retention in PCRAM. Accordingly, there also exists a need for block or area erase in multilevel phase-change operation. This block or area erase of PCRAMS operating in the multilevel mode may be referred to as multilevel programming In an embodiment, a SET pulse may include a single electrical pulse with short duration and high voltage coupled with a DC bias pulse. In an embodiment, the SET pulse may control the crystallization processes and drive all phase-change memory cells in PCRAM to a common SET state, regardless of the previous memory states of the phase-change memory cells.

In an embodiment, lower applied voltages may be achieved by varying the shape and/or duration of the SET pulse. In an embodiment, the lower amplitude SET pulse may be compatible with low voltage CMOS technology. In an embodiment, a bias pulse may be used to prevent quenching and/or the re-amorphization of a phase-change material after a high voltage electrical pulse is employed. In an embodiment, the SET pulse may enable multilevel programming of the phase-change memory cell from the medium range resistance levels to a common lowest resistance SET level. In an embodiment, the SET pulse may improve the consistency of the SET resistance levels and achieve a better or larger sensing-margin. Longer lifetime may also be achieved as the SET pulse may also be used to re-initialize the PCRAM and prevent it from degradation after a high number of SET/RESET cycles.

Figure 5:
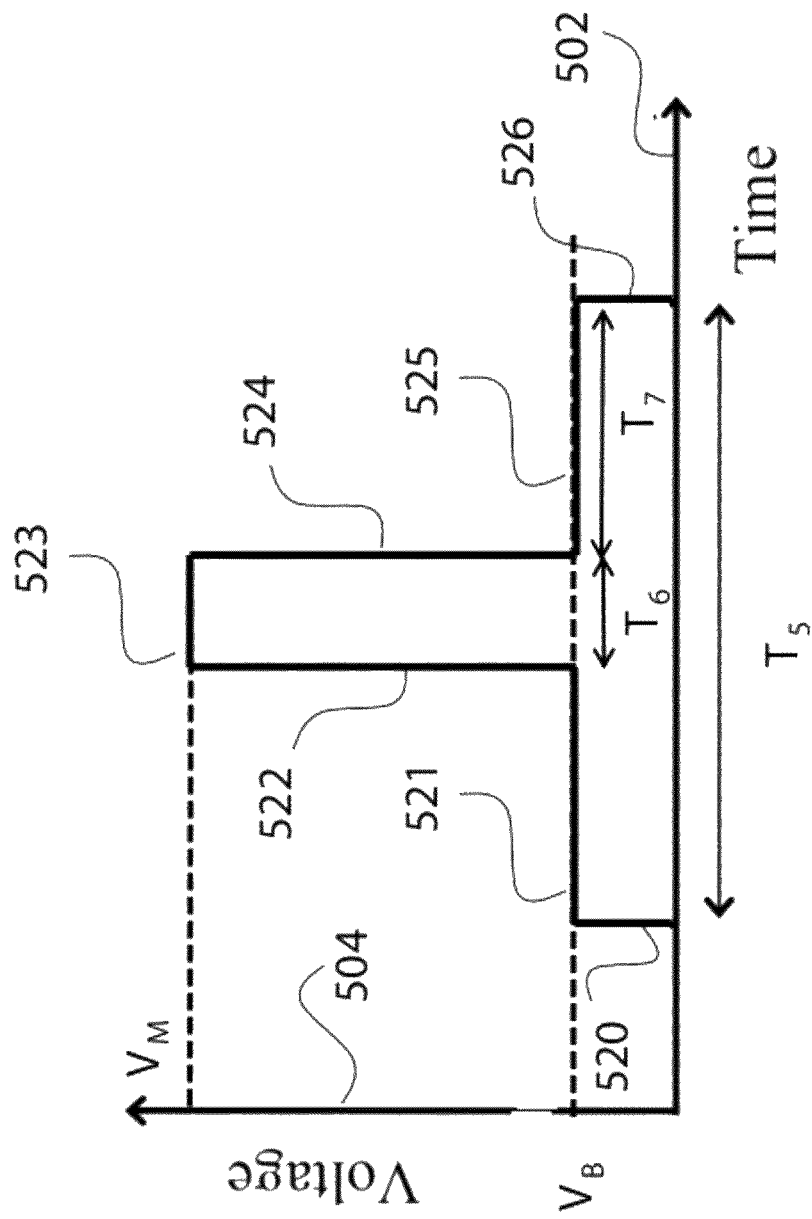
FIG. 5 shows a SET pulse for multilevel programming according to an embodiment.

FIG. 5 shows a SET pulse for multilevel programming according to an embodiment. The shape of the SET pulse 500 is illustrative and not intended to be limiting. Time increases along a horizontal axis 502 and voltage increases along a vertical axis 504. In an embodiment, SET pulse 500 may include an initial leading edge 520 and a plateau 521. In an embodiment, a sufficiently high bias voltage $V_B$ may be employed to SET the PCRAM from the highest resistance level or from any other resistance level greater than the lowest SET resistance level. In an embodiment, the range of the bias voltage $V_B$ may be from 0.1 V to 0.3 V. In an embodiment, the pulse duration $T_5$ may range from nanoseconds to microseconds, depending on phase-change material parameters such as, for example, dimensions of the phase-change memory cell, the composition of the chalcogenide alloy of the phase-change material, the threshold switching voltage of the phase change memory cell, among other things. In an embodiment, the time duration $T_5$ may be in the range of about 1 nanosecond to about 500 microseconds, or in the range of about nanoseconds to about 200 microseconds, or in the range of about 100 nanoseconds to about 100 microseconds, or in the range of about 500 nanoseconds to about 80 microseconds, or in the range of about 800 nanoseconds to about 50 microseconds, or in the range of about 1 microsecond to about 30 microseconds, or in the range of about 10 microseconds to about 20 microseconds.

In an embodiment, the leading edge 522 and plateau 523 may result in heating of the phase-change material to a temperature above the glass transition temperature. In an embodiment, the voltage $V_M$ may be sufficiently high and the pulse duration sufficiently long to SET the PCRAM from the highest resistance level or from any other resistance level greater than the lowest SET resistance level. In an embodiment, the voltage $V_M$ may be in the range from 0.3 V to 10 V, such as, for example, from 0.3 V to 10 V, or from 1 V to 9 V, or from 2 V to 8 V, or from 3 V to 7 V, or from 4 V to 6 V. In an embodiment, the pulse duration $T_6$ may be in the range from a few nanoseconds to several ten nanoseconds, depending on phase-change material parameters such as, for example, dimensions of the phase-change memory cell, the composition of the chalcogenide alloy of the phase-change material, the threshold switching voltage of the phase change memory cell, among other things. In an embodiment, the time duration $T_6$ may be in the range of about 1 nanosecond to about 90 nanoseconds, or in the range of about 10 nanoseconds to about 80 nanoseconds, or in the range of about 30 nanoseconds to about 60 nanoseconds.

In an embodiment, the trailing/falling edge 524 may bring the amplitude $V_M$ down to the plateau 525 having the same level as or having a different level from the plateau 521. In an embodiment, another trailing/falling edge 526 may bring the amplitude of plateau 525 down to zero. In an embodiment, this may correspond to the heating of the phase-change material below the glass transition temperature. Similar to the leading edge 520 and plateau 521, a high bias voltage for plateau 525 and long heating time $T_7$ may be required to SET the PCRAM from the highest resistance level. In an embodiment, the amplitude of plateau 525 may be in the range of 0.1 V to 0.3 V. In an embodiment, the heating time $T_7$ could be from nanoseconds to microseconds, depending on phase-change material parameters such as, for example, dimensions of the phase-change memory cell, the composition of the chalcogenide alloy of the phase-change material, the threshold switching voltage of the phase change memory cell, among other things. In an embodiment, the time duration $T_7$ may be in the range of about 1 nanosecond to about 500 microseconds, or in the range of about 50 nanoseconds to about 200 microseconds, or in the range of about 100 nanoseconds to about 100 microseconds, or in the range of about 500 nanoseconds to about 80 microseconds, or in the range of about 800 nanoseconds to about 50 microseconds, or in the range of about 1 microsecond to about 30 microseconds, or in the range of about 10 microseconds to about 20 microseconds.

Figure 6:
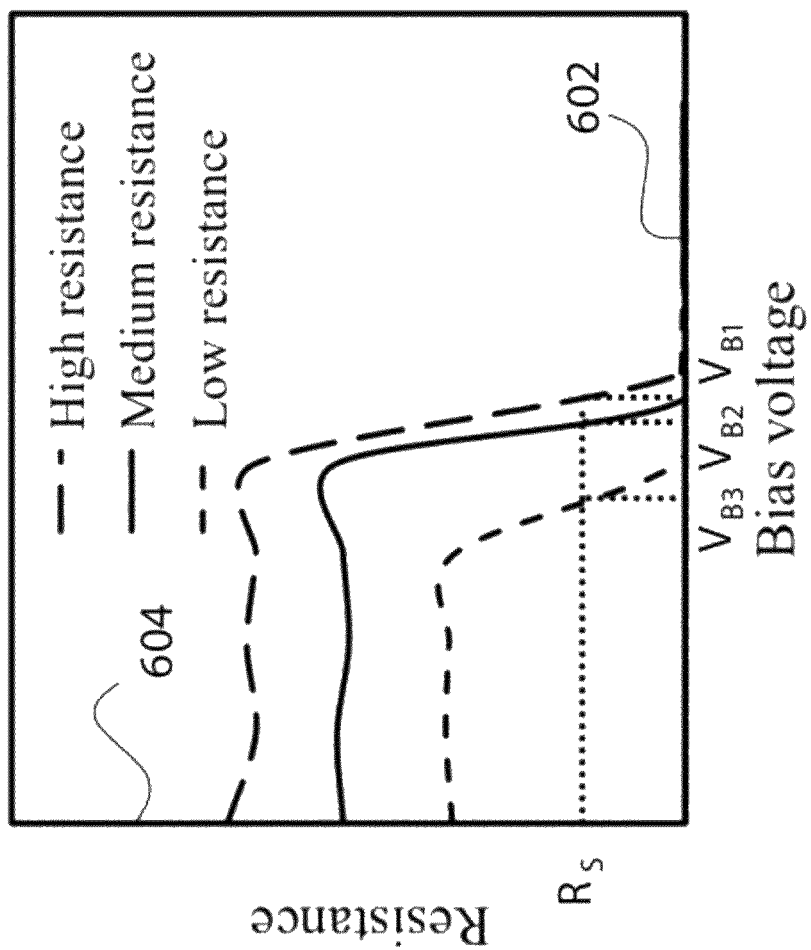
FIG. 6 shows the correlation between PCRAM resistance states and bias voltage according to an embodiment.

FIG. 6 shows the correlation between PCRAM resistance states and bias voltage according to an embodiment. The shape of the curves is illustrative and not intended to be limiting. Bias voltage along a horizontal axis 602 and resistance increases along a vertical axis 604. In an embodiment, a bias voltage $V_{B1}$ may be required to SET the PCRAM from a high resistance state to the SET resistance $R_S$. In an embodiment, a bias voltage $V_{B2}$ may be required to SET the PCRAM from a medium resistance state to the SET resistance $R_S$. In an embodiment, a bias voltage $V_{B3}$ may be required to SET the PCRAM from a low resistance state to the SET resistance $R_S$. In an embodiment, the bias voltages $V_{B1}$, $V_{B2}$, and $V_{B3}$ may be different, and each of the bias voltages $V_{B1}$, $V_{B2}$, and $V_{B3}$ may depend on phase-change material parameters such as, for example, dimensions of the phase-change memory cell, the composition of the chalcogenide alloy of the phase-change material, among other things. In an embodiment, each of bias voltages $V_{B1}$, $V_{B2}$, and $V_{B3}$ may be in the range of 0.1 V to 0.3 V.

Figure 7:
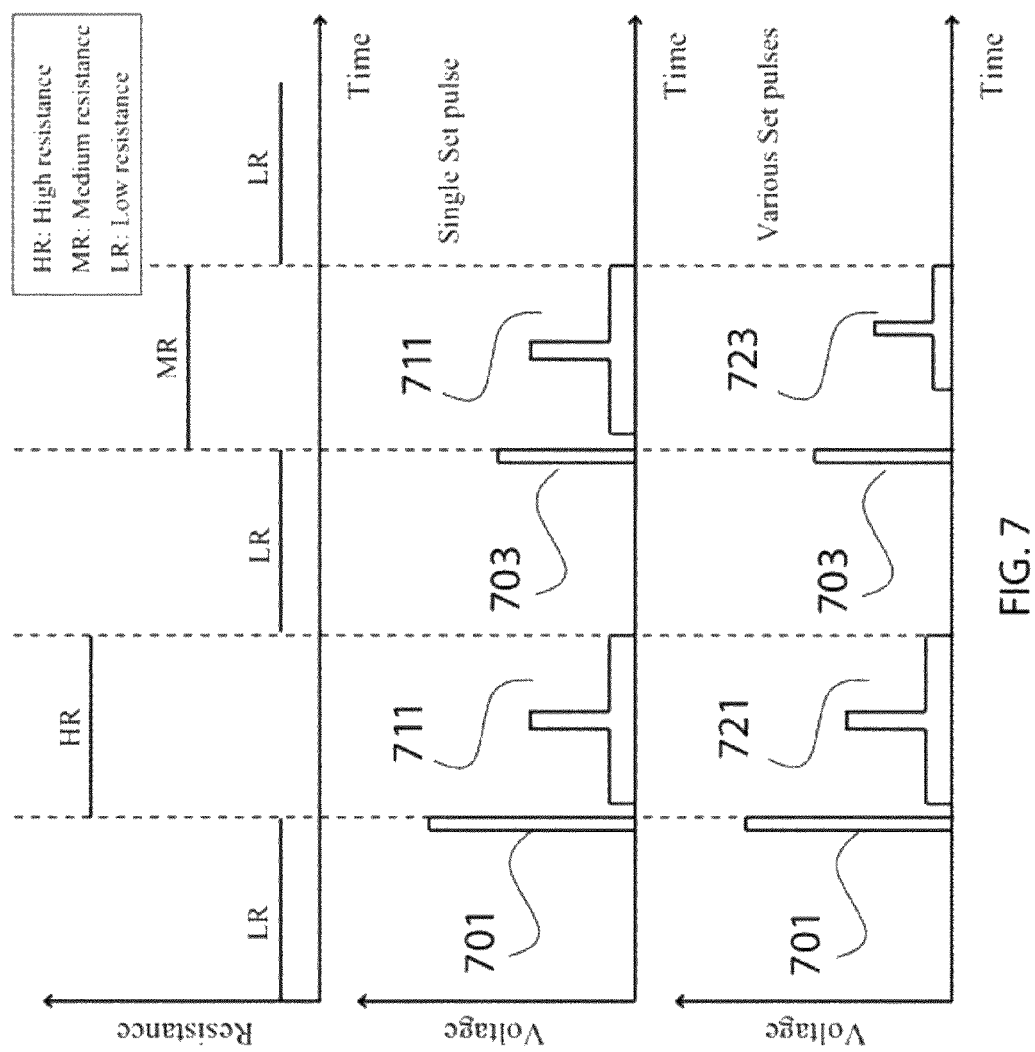
FIG. 7 shows a multilevel programming cycle according to an embodiment.

FIG. 7 shows a multilevel programming cycle according to an embodiment. The shape of the pulses is illustrative and not intended to be limiting. In an embodiment, a single SET pulse may be used to switch the PCRAM to the common lowest resistance SET level, regardless of the previous high resistance levels. In an embodiment, various SET pulses of varying amplitudes and widths may be used to switch the PCRAM to the common lowest resistance SET level.

In an embodiment, RESET pulses 701 and 703 with different pulse conditions may be used to RESET phase-change memory cells to a high resistance state HR or a medium resistance state MR. In an embodiment, the fractional crystallinity of the phase-change material in the medium resistance state is higher than the fractional crystallinity of the phase-change material in the high resistance state. In an embodiment, a single SET pulse 711 may be employed to switch the phase-change memory cells to a common SET level having lowest resistance LR, i.e., the SET state, regardless of the previous resistance level of the phase-change memory cell. In an embodiment, the single SET pulse 711 may include a sufficiently high bias pulse and a high amplitude electrical pulse. In an embodiment, the single SET pulse 711 may enable the complete crystallization of the phase-change material from different resistance levels.

In another embodiment, various SET pulses 721, 723 with different voltages and/or durations may be employed to switch the phase-change memory cells to a common SET level having lowest resistance, regardless of the previous resistance level of the phase-change memory cell. In an embodiment, the various SET pulses may be employed for low power and/or high speed data transfer. In an embodiment, a SET pulse 721 with high voltage and long duration may be required to SET the PCRAM from a high resistance state. In an embodiment, a SET pulse 723 with lower power and shorter duration pulse may be employed to SET the PCRAM from a medium-range resistance state. The above methods may ensure the complete SET programming of the PCRAM to the same low resistance level LR.

Figure 8:
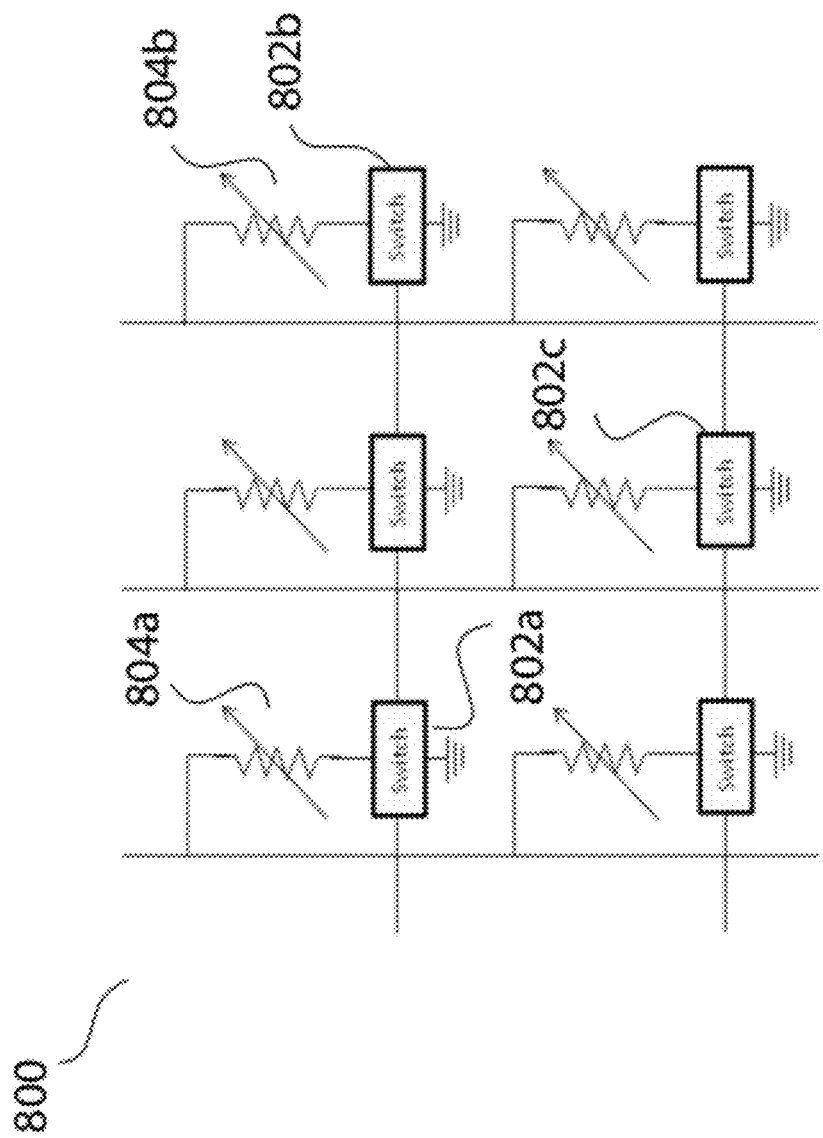
FIG. 8 shows a schematic diagram of a portion of a phase change memory array integrating with IC switches according to an embodiment.

FIG. 8 shows a schematic diagram of a portion of a phase change memory array integrating with IC switches according to an embodiment. The schematic diagram, including its components and the layout of its components, is illustrative and not intended to be limiting. In an embodiment, a memory array 800 may include one or more resistive memory cells 804a, 804b. In an embodiment the memory array 800 may be further integrated with IC switches 802a, 802b, 802c, such as, for example, with transistors (including, but not limited to, MOSFETs, JFETs), diodes, among other alternatives that may serve the same function. In an embodiment, a programming circuit may be coupled with the one or more resistive memory cells 804a, 804b of the memory array 800. The programming circuit may be configured in use to provide a programming signal to the one or more resistive memory cells 804a, 804b to program the one or more resistive memory cells 804a, 804b. In an embodiment, the IC switches 802a, 802b, 802c may be used to select the resistive memory cell to be programmed. For example, when IC switch 802a is switched ON and IC switch 802b is switched OFF, resistive memory cell 804a is selected for programming with the programming signal from programming circuit, whilst resistive memory cell 804b is unaffected by the programming signal.

In an embodiment, the programming signal may include an electrical pulse, and a bias pulse coupled with the electrical pulse. In an embodiment, the electrical pulse may include an electrical pulse portion, and the bias pulse may include at least two bias pulse portions. In a further embodiment, the electrical pulse portion may be positioned between the at least two bias pulse portions, wherein the bias pulse may include a voltage below a threshold switching voltage of the one or more resistive memory cells 804a, 804b. In an embodiment, the programming signal may include a peak voltage above the threshold switching voltage of the one or more resistive memory cells 804a, 804b. In an embodiment, the one or more resistive memory cells 804a, 804b of the memory array 800 include one or more phase change memory cells.

In an embodiment, the programming signal may include an electrical pulse portion, and at least two bias pulse portions, the electrical pulse portion being positioned between the at least two bias pulse portions. In an embodiment, each of the at least two bias pulse portions may include a respective voltage below a threshold switching voltage of the one or more resistive memory cells 804a, 804b. In an embodiment, the programming signal may include a peak voltage above the threshold switching voltage of the one or more resistive memory cells 804a, 804b. In an embodiment, the one or more resistive memory cells 804a, 804b of the memory array 800 include one or more phase change memory cells.

Figure 9:
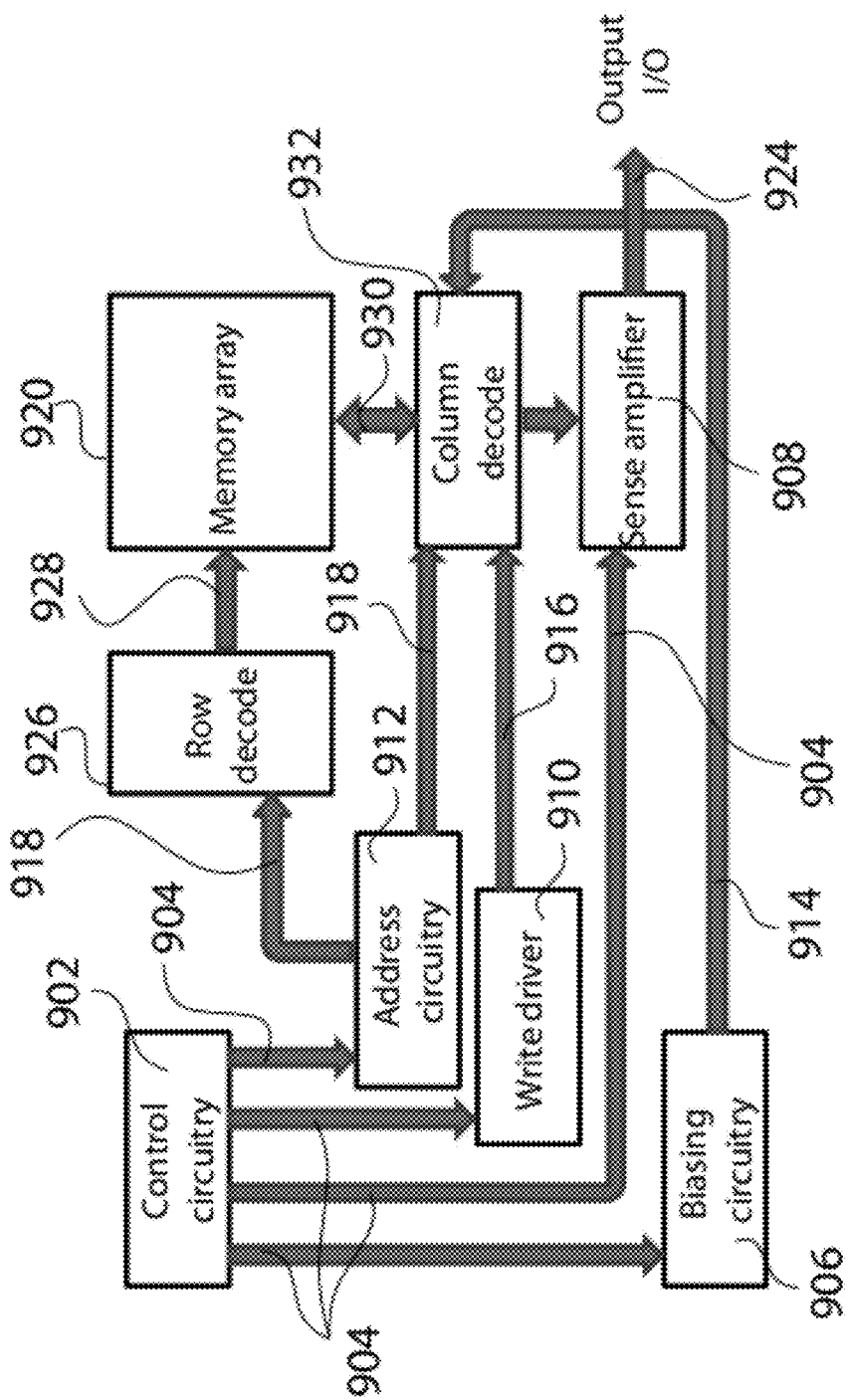
FIG. 9 shows a block diagram of a phase change memory IC for memory chip implementation according to an embodiment.

FIG. 9 shows a block diagram of a phase change memory IC for memory chip implementation according to an embodiment. In an embodiment, the phase change memory IC may include control circuitry 902 configured to generate a control signal 904. In an embodiment, the control signal 904 may be a read control pulse (such that a read operation is performed on a phase change memory cell) or a write control pulse (such that information is written into a phase change memory cell). In an embodiment, the control signal 904 may be transmitted to each of a biasing circuitry 906, a sense amplifier 908, a write driver 910, and an address circuitry 912. In an embodiment, the control circuitry 902 may be configured to control the biasing circuitry 906 and the write driver 910. The write driver 910 may be configured to provide a SET pulse and/or a RESET pulse. In an embodiment where the write driver 910 is configured to provide a SET pulse, the biasing circuitry 906 may be configured to generate a bias pulse 914, such as, for example, the bias pulse 103 in FIG. 1, or the bias pulses 221 and 225 of the SET pulse of FIG. 2, or the bias pulses 521 and 525 of the SET pulse of FIG. 5. In an embodiment, the write driver 910 may be configured to generate the required voltages 916 for the SET pulse, such as, for example, the amplitudes of each of plateaus 221, 223 and 225 of the SET pulse of FIG. 2, or the amplitudes of each of the plateaus 521, 523 and 525 of the SET pulse of FIG. 5. In an embodiment where the write driver 910 is configured to provide a RESET pulse, the write driver 910 may be configured to generate the required voltages 916 for the RESET pulse, with or without the use of the bias pulses. With the RESET pulse, the resistive memory cells of the memory array 920 may be reset to a high resistance state.

In an embodiment, the control circuitry 902 may be configured to control the address circuitry 912 and the sense amplifier 908. In an embodiment, the address circuitry 912 may be configured to generate a logical address 918, wherein the logical address 918 may be used to select one or more resistive memory cells in a memory array 920 for programming. In an embodiment, the logical address 918 may be generated by a different circuit or IC chip and consequently relayed to the address circuitry 912. In an embodiment, the sense amplifier 908 may be configured to sense the signals 922 read on a bit-line when a read operation is performed on the memory array 920. In an embodiment, the sense amplifier 908 may be further configured to convert the small amplitude of the signals 922 read on the bit-line to full range digital signals 924, i.e., the small signals 922 read on the bit-line are amplified.

In an embodiment, the memory array 920 may include a plurality of resistive memory cells, such as, for example, a plurality of phase change memory cells arranged in N rows and M columns, such as, for example, the memory array 800 of FIG. 8 including a plurality of resistive memory cells arranged in 2 rows and 3 columns. In an embodiment, a row decoder 926 may include an n-to-$2^n$ decoder, configured to convert the logical address 918 to a row address select line 928, wherein the row address select line 928 selects one row of the N rows of resistive memory cells included in the memory array 920. In an embodiment, a column decoder 932 may include an m-to-$2^m$ decoder to convert the logical address 918 to a column address select line 930, wherein the column address select line 930 selects one column of the M columns of resistive memory cells included in the memory array 920. For example, if the column address select line 930 is configured to select the $3^{rd}$ column of a memory array 800 of FIG. 8 (wherein column enumeration starts from the left) and the row address select line 928 is configured to select the $1^{st}$ row of the memory array 800 of FIG. 8 (wherein row enumeration starts from the top), then select lines 930 and 928 may result in IC switch 802b being switched ON and thus, the selection of resistive memory cell 804b. Accordingly, resistive memory cell 804b may be read if the control signal 904 is a read control pulse. Alternatively, resistive memory cell 804b may be programmed (or written) if the control signal 904 is a write control pulse. Accordingly, the cooperating effects of the address circuitry 912 and the sense amplifier 908 provide typical memory device functions often provided by standard architecture.

Alternative pulse profiles corresponding to those described. In various embodiments, these alternatives include all forms of modifications to the bias voltage, applied voltage and/or pulse durations. In addition, the alternative pulses used may also be used to SET the PCRAM to the common lowest level SET resistance state from a higher resistance state to the common low resistance level.

While the invention has been particularly shown and described with reference to specific example embodiments, it should be understood by those skilled in the art that various changes in form and detail may be made therein without departing from the spirit and scope of the invention as defined by the appended claims. The elements of the various embodiments may be incorporated into each of the other species to obtain the benefits of those elements in combination with such other species, and the various beneficial features may be employed in embodiments alone or in combination with each other. The scope of the invention is thus indicated by the appended claims and all changes which come within the meaning and range of equivalency of the claims are therefore intended to be embraced.

The invention claimed is:

1. A method for programming a resistive memory cell, the method comprising:
   providing a programming signal to the resistive memory cell, the programming signal comprising:
     an electrical pulse, and
     a bias pulse coupled with the electrical pulse;
   wherein the electrical pulse comprises an electrical pulse portion, and the bias pulse comprises at least two bias pulse portions, the electrical pulse portion being positioned between the at least two bias pulse portions,
   wherein the bias pulse comprises a voltage below a threshold switching voltage of the resistive memory cell, and
   wherein the programming signal comprises a peak voltage above the threshold switching voltage of the resistive memory cell.

2. The method according to claim 1, wherein the resistive memory cell comprises a phase change memory cell.

3. The method according to claim 1, wherein providing the programming signal reduces the resistance of the resistive memory cell to a level corresponding to a SET state of the resistive memory cell.

4. The method according to claim 1, wherein the threshold switching voltage is in the range from about 0.3 V to about 2 V.

5. The method according to claim 4, wherein the threshold switching voltage is in the range from about 0.4 V to about 1 V.

6. The method according to claim 5, wherein the threshold switching voltage is in the range from about 0.6 V to about 0.8 V.

7. The method according to claim 1, wherein the duration of the bias pulse is longer than the duration of the electrical pulse.

8. The method according to claim 1, wherein the duration of the bias pulse is in the range of nanoseconds to microseconds.

9. The method according to claim 1, wherein the duration of the electrical pulse is in the range from about 10 nanoseconds to about 1 microsecond.

10. The method according to claim 1, wherein the duration of the electrical pulse is in the range from about 1 nanosecond to about 100 nanoseconds.

11. The method according to claim 1, wherein the resistive memory cell is a binary memory cell.

12. The method according to claim 1, wherein the resistive memory cell is a multilevel memory cell.

13. The method according to claim 12, wherein a first programming signal is provided for programming the multilevel memory cell in a first resistance level, and a second programming signal is provided for programming the multilevel memory cell in a second resistance level, wherein the first resistance level is different from the second resistance level.

14. The method according to claim 13, wherein the first resistance level and the second resistance level are different from a lowest resistance level of the multilevel memory cell, wherein the lowest resistance level corresponds to the SET state of the multilevel memory cell.

15. The method according to claim 12, wherein depending on the resistance level of the multilevel memory cell, various programming signals are provided for programming the multilevel memory cell, the various programming signals varying in one or more of the following:
   voltage of the bias pulse,
   the peak voltage of the programming signal,
   the duration of the bias pulse,
   the duration of the electrical pulse.

16. A method for programming one or more resistive memory cells in a resistive memory array, the method comprising:
  providing a programming signal to the one or more resistive memory cells, the programming signal comprising:
    an electrical pulse, and
    a bias pulse coupled with the electrical pulse;
  wherein the electrical pulse comprises an electrical pulse portion, and the bias pulse comprises at least two bias pulse portions, the electrical pulse portion being positioned between the at least two bias pulse portions,
  wherein the bias pulse comprises a voltage below a threshold switching voltage of the one or more resistive memory cells, and
  wherein the programming signal comprises a peak voltage above the threshold switching voltage of the one or more resistive memory cells.

17. The method according to claim 16, wherein the one or more resistive memory cells comprise one or more phase change memory cells.

18. A method for programming a resistive memory cell, the method comprising:
  providing a programming signal to the resistive memory cell, the programming signal comprising:
    an electrical pulse portion, and
    at least two bias pulse portions, the electrical pulse portion being positioned between the at least two bias pulse portions;
  wherein each of the at least two bias pulse portions comprises a respective voltage below a threshold switching voltage of the resistive memory cell, and
  wherein the programming signal comprises a peak voltage above the threshold switching voltage of the resistive memory cell.

19. A memory apparatus comprising a memory array, the memory array comprising:
  one or more resistive memory cells; and
  a programming circuit coupled with the one or more resistive memory cells and configured in use to provide a programming signal to the one or more resistive memory cells to program the one or more resistive memory cells, the programming signal comprising:
    an electrical pulse, and
    a bias pulse coupled with the electrical pulse;
  wherein the electrical pulse comprises an electrical pulse portion, and the bias pulse comprises at least two bias pulse portions, the electrical pulse portion being positioned between the at least two bias pulse portions,
  wherein the bias pulse comprises a voltage below a threshold switching voltage of the one or more resistive memory cells, and
  wherein the programming signal comprises a peak voltage above the threshold switching voltage of the one or more resistive memory cells.

20. The memory apparatus according to claim 19, wherein the one or more resistive memory cells comprise one or more phase change memory cells.

21. A memory apparatus comprising a memory array, the memory array comprising:
  one or more resistive memory cells; and
  a programming circuit coupled with the one or more resistive memory cells and configured in use to provide a programming signal to the one or more resistive memory cells to program the one or more resistive memory cells, the programming signal comprising:
    an electrical pulse portion, and
    at least two bias pulse portions, the electrical pulse portion being positioned between the at least two bias pulse portions;
  wherein each of the at least two bias pulse portions comprises a respective voltage below a threshold switching voltage of the one or more resistive memory cells, and
  wherein the programming signal comprises a peak voltage above the threshold switching voltage of the one or more resistive memory cells.

22. The memory apparatus according to claim 21, wherein the one or more resistive memory cells comprise one or more phase change memory cells.

* * * * *